(12) United States Patent  (10) Patent No.: US 8,618,631 B2
Jin et al.  (45) Date of Patent: Dec. 31, 2013

(54) ON-CHIP FERRITE BEAD INDUCTOR

(75) Inventors: Jun-De Jin, Hsinchu (TW); Tzu-Jin Yeh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 115 days.

(21) Appl. No.: 13/372,873

(22) Filed: Feb. 14, 2012

(65) Prior Publication Data

US 2013/0207230 A1 Aug. 15, 2013

(51) Int. Cl.
*H01L 27/08* (2006.01)
*H01L 29/66* (2006.01)
*H01L 21/00* (2006.01)

(52) U.S. Cl.
USPC ............... 257/531; 257/277; 257/E27.148; 257/E21.022; 438/3

(58) Field of Classification Search
None
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,173,318 B2 * | 2/2007 | Liu et al. | 257/531 |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 2003/0234436 A1 * | 12/2003 | Hsu et al. | 257/531 |
| 2007/0178608 A1 * | 8/2007 | Sun et al. | 438/3 |
| 2013/0119511 A1 * | 5/2013 | Shi et al. | 257/531 |

* cited by examiner

*Primary Examiner* — Julio J Maldonado
*Assistant Examiner* — Harpreet Singh
(74) *Attorney, Agent, or Firm* — Duane Morris LLP

(57) ABSTRACT

A semiconductor structure having an in situ chip-level ferrite bead inductor and method for forming the same. Embodiments include a substrate, a first dielectric layer formed on the substrate, a lower ferrite layer formed on the first dielectric layer, and an upper ferrite layer spaced apart from the lower ferrite layer in the structure. A first metal layer may be formed above the lower ferrite layer and a second metal layer formed below the upper ferrite layer, wherein at least the first or second metal layer has a coil configuration including multiple turns. At least one second dielectric layer may be disposed between the first and second metal layers. The ferrite bead inductor has a small form factor and is amenable to formation using BEOL processes.

20 Claims, 6 Drawing Sheets

ON-CHIP FERRITE BEAD INDUCTOR

FIELD

The present invention generally relates to semiconductors structures, and more particularly to semiconductor structures including an integrated passive device (IPD) such as a ferrite bead inductor and methods for forming the same.

BACKGROUND

The present major trend in semiconductor fabrication is integration of 2.5D and 3D IC chip or die packages having vertically stacked chips and direct electrical inter-chip connections in lieu of other interconnect techniques such as wire bonds and chip edge interconnects. The dies in such IC chip packages may include fine (small) pitch vertical through substrate vias (TSVs) which may be used to form a direct electrical connection to an adjoining stacked die. TSVs offer higher density interconnects and shorter signal paths creating the possibility of forming die packages having smaller form factors and thin die stacks. The TSVs in top dies may be terminated on the back side with very fine pitch microbump arrays for final interconnection to and mounting on a semiconductor substrate. The compact die stacks in 2.5D/3D IC chip packages provide a small form factor consistent with the goal of producing smaller semiconductor devices.

In 2.5D/3D IC chip packages, interposers may be used to make electrical connections between adjoining dies or between die packages and another semiconductor substrate which may include various electrically conductive interconnects such as redistribution layer (RDL) structures in some embodiments that may be used to increase or decrease the pitch spacing of the electrical contacts to aid with eventual final mounting of the chip package on another substrate, which may be a package printed circuit board (PCB), packaging substrate, high-density interconnect, or other.

Some semiconductor structures incorporating 2.5D/3D IC technology may include various passive devices. One such passive device is a board-level SMD (surface mount device) ferrite bead inductor. Ferrite bead inductors ("ferrite beads") generally include input and output terminals, and conductive metallic leads or traces combined with an associated magnetic core material such as ferrite. Ferrite beads function as passive low-pass noise suppression filters or shields that attenuate high frequency EMI/RFI (electromagnetic interference or radio frequency interference) noise from internal or external sources that may interfere with the proper performance of circuits and devices formed in a semiconductor package. Board level SMD ferrite beads are discrete devices which are fabricated separately and then mounted on a semiconductor package substrate or PCB (printed circuit board). Accordingly, SMD ferrite beads have a relatively large form factor and consume valuable real estate when mounted on the PCB. SMD ferrite beads are not compatible for integration with the silicon-based CMOS (complementary metal-oxide semiconductor) chip fabrication processes.

An integrated passive device (IPD) chip-level or "on-chip" ferrite bead inductor with small form factor is desired that can be integrated with the silicon-based chip semiconductor fabrication process.

BRIEF DESCRIPTION OF THE DRAWINGS

The features of the preferred embodiments will be described with reference to the following drawings where like elements are labeled similarly, and in which.

Figure 1:
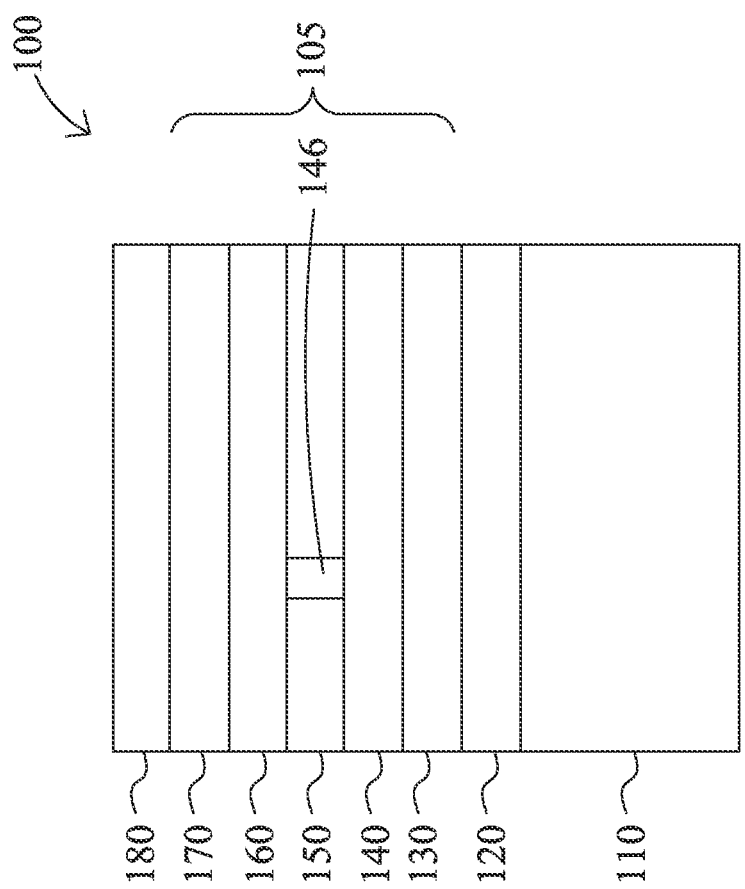
FIG. 1 is a cross-sectional side view of a first embodiment of a semiconductor structure having an in situ chip level ferrite bead inductor according to the present disclosure.

All drawings are schematic and are not drawn to scale.

DETAILED DESCRIPTION

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. The term "adjacent" as used herein to describe the relationship between structures/components includes both direct contact between the respective structures/components referenced and the presence of other intervening structures/components between respective structures/components. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

FIG. 1 shows a first embodiment of a semiconductor structure 100 such as a chip including an in situ chip level or "on-chip" ferrite bead inductor 105 (also referred to as "ferrite bead" herein for brevity) according to the present disclosure. The semiconductor structure 100 with ferrite bead 105 may be formed by BEOL (back-end-of-line) semiconductor fabrication processes as are well known to those in the art. Accordingly, such a ferrite bead inductor 105 may be considered an integrated passive device (IPD) or thin film CMOS IPD being integrated within the chip as opposed to a board level SMD.

Semiconductor structure 100 includes, in sequence, a substrate 110, a first dielectric layer 120 formed thereon, a first lower ferrite layer 130 formed thereon, a first metal layer 140 formed thereon, a second dielectric layer 150 formed thereon, a second metal layer 160 formed thereon, a second upper ferrite layer 170 formed thereon, and a third top dielectric layer 180 formed thereon. In some embodiments, substrate 110 may be formed of silicon or a high-resistivity (Hi-R) silicon and contain active discrete CMOS devices. In other embodiments, substrate 110 may be a silicon or H-R silicon interposer without active devices. Semiconductor structure 100 above substrate 110 with alternating metal and dielectric layers may be an interconnect metal layer of a chip in some embodiments containing interconnect circuits consisting of trenches, vias, plugs, etc. Accordingly, in some embodiments the ferrite bead inductor 105 may be integrated with and formed in a portion of the metal layer.

Substrate 110 may have any suitable thickness. In one example, without limitation, substrate 110 may have a representative thickness of about 700 microns. Other suitable thicknesses, however, may be used. In one embodiment, an H-R silicon may be used with a relative permittivity (∈r) of about 11.9.

Dielectric layers 120, 150, and 180 may be any suitable type of dielectric material used in semiconductor fabrication processes. In one exemplary embodiment, without limitation, the dielectric material used may be silicon dioxide (SiO2) having a relative permittivity (∈r) of about 3.9. Any kind of dielectric material with other relative permittivities may be used as appropriate. In some exemplary embodiments, dielectric layers 120 and 180 may have a thickness of about 1 micron in some embodiments. Dielectric layer 150 disposed between metal layers 140 and 160 may have a thickness of about 3 microns in some embodiments, or may be the same as dielectric layers 120 and 180. Accordingly, any thicknesses for dielectric layers 120, 150, and 180 may be used as appropriate.

Dielectric layers 120, 150, and 180 may be deposited by any suitable method, such as without limitation CVD (chemical vapor deposition) or PVD (physical vapor deposition).

In some embodiments, ferrite layers 130 and 170 may be a solid or continuous and unpatterned. Ferrite layers 130, 170 may be substantially flat or planar as shown in FIG. 1, and in one embodiment may have a horizontal width and depth dimensioned to extend at least as wide and deep as the conductive leads formed in their corresponding respective adjacent metal layer 140 or 160. In some embodiments, ferrite layers 130, 170 may be patterned by photolithography and etching to have a pattern that is identical or nearly identical to the pattern of the conductive leads formed in adjacent metal layers 140 or 160, respectively. In one embodiment, ferrite layers 130, 170 do not extend vertically through or beyond their respective adjacent metal layers 140 or 160 which are sandwiched between the ferrite layers as shown in FIG. 1.

Ferrite layers 130, 170 may have a representative thickness, without limitation, of about 3 microns in some embodiments. Ferrite layers 130, 170 may have a permeability of about 50. The ferrite layers 130, 170 may be disposed above/below and adjacent to metal layers 140 and 160 as shown. The ferrite layers may be deposited or formed by any suitable method, such as without limitation CVD or PVD in some embodiments.

Ferrite layers 130 and 170 may be made of any suitable type of ferrite. In some embodiments, the ferrite used may have a permeability ranging from about 1-1000

With continuing reference to FIG. 1, metal layers 140 and 160 may be deposited and formed in direct contact with the ferrite layers 130, 170. Metal layers 140 and 160 may be deposited by any suitable method, including sputtering, plating, and others.

Figure 2:
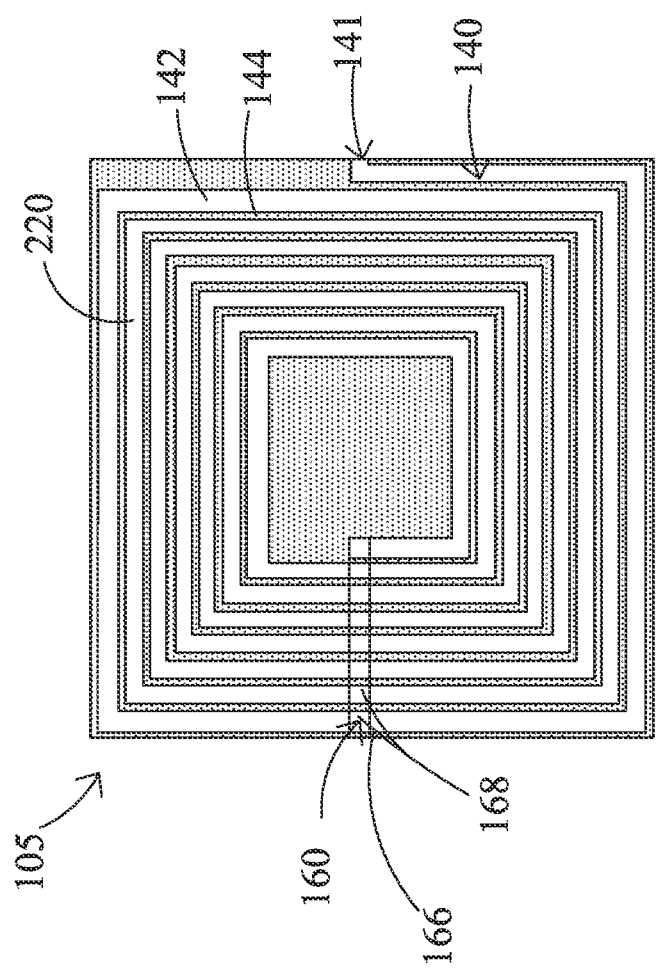
FIG. 2 is a top view thereof showing only the metal layers.
Figure 5:
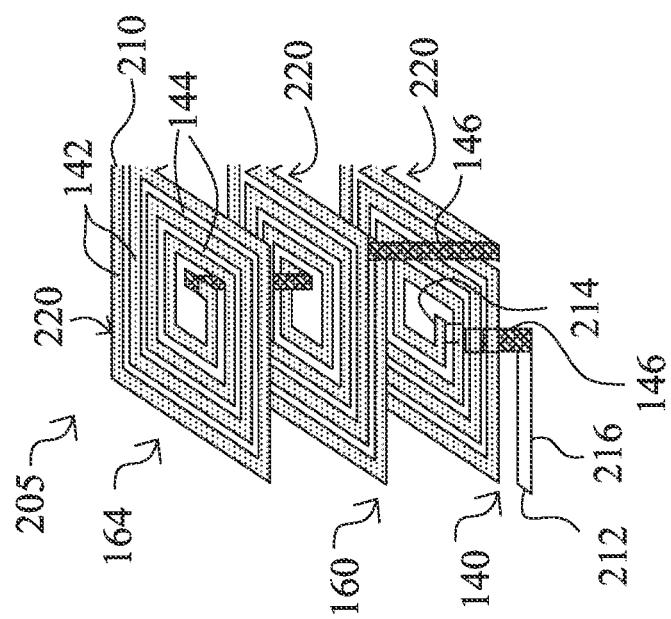
FIG. 5 is a perspective view of the metal layers and conductors thereof disembodied from the semiconductor structure.

In some embodiment, metal layer 160 may be patterned and include solid conductor areas forming conductive leads 142 and open areas 144 between the leads, as shown for example in FIGS. 2 and 5. Leads 142 may have any suitable configuration including one or more straight segments which may be conjoined and arranged at an angle to an adjoining segment as shown to form a continuous conductive lead having numerous configurations.

In one embodiment, individual adjoining leads 142 may be arranged at a 90 degree angle to each other and form a rectilinear spiral pattern having multiple angular "turns" to form a metal coil 220 as shown in FIGS. 2 and 5. In some embodiments, an open central area may be formed at the center of the coiled or spiral pattern as best shown in FIGS. 2 and 5. Any suitable number of turns may be provided depending on the particular design parameters and intended application for the inductor. The spiral leads 142 may be symmetrically and concentrically arranged around the open center of the spiral metal pattern. Leads 142 may be rectangular in cross-sectional shape in some embodiments as best shown in FIG. 5.

Patterned leads 142 may be formed by any suitable BEOL (back end of line) process used in the art, including damascene and dual damascene processes involving patterned photolithography, etching, and film deposition.

Metal layers 140 and 160 may be made of any suitable conductive material amenable for formation by BEOL process. In some embodiments, without limitation, metal layers 140 and 160 may be made of copper or aluminum. Metal layers 140 and 160 may have representative thicknesses of about 6 microns in some embodiments and conductivities of about $5.8 \times 10^7$.

FIG. 2 is a top view of the ferrite bead inductor 105 shown in cross-section in FIG. 1. The upper metal layer 160 that defines leads 142 forms a coiled or spiral pattern which defines an input terminal 141 for connection to the next wiring level and circuit formed above in semiconductor structure 100 or a lateral circuit at the same level. The lower metal layer 140 forms a straight lead 168 to bring the output terminal 166 back outside from inside the spiral for connection to the next wiring level and circuit formed below in semiconductor structure 100 or a lateral circuit at the same level. Lead 168 may be electrically connected to lead 142 at a different level in the semiconductor structure by a conductive via 146 which may be made of any suitable conductive material including copper, aluminum, tungsten, and other conductive metals or alloys.

Figure 3:
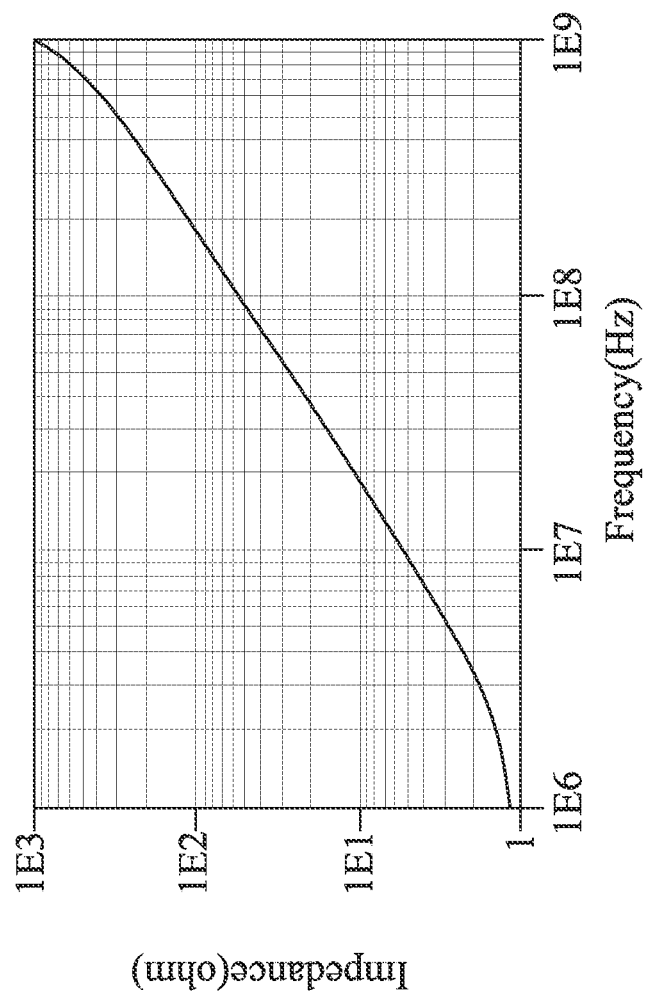
FIG. 3 is a graph showing the impedance characteristic of the ferrite bead inductor of FIGS. 1 and 2.

The inventors fabricated and tested the chip-level IPD ferrite bead inductor 105 shown in FIGS. 1 and 2 for comparison of performance with board-level surface mounted device (SMD) ferrite beads. The graph in FIG. 3 shows the performance of ferrite bead inductor 105 according to the present disclosure. At a frequency of 100 MHz, the impedance was found to be approximately 56 ohm as shown in the graph which compares favorably with the performance of a SMD ferrite bead.

Accordingly, the IPD ferrite bead inductor 105 according to the present disclosure advantageously can provide the same performance as a board-level SMD inductor, but with a much smaller form factor (i.e. physical size). One typical SMD inductor, for example, may have a form factor of 0.054 mm$^3$ (0.6 mm×0.3 mm×0.3 mm). By contrast, the IPD ferrite bead inductor 105 shown in FIGS. 1 and 2 has a smaller form factor of about 0.018 mm$^3$ (0.98 mm×0.88 mm×0.021 mm). The IPD ferrite bead inductor 105 therefore consumes less available space in the semiconductor structure allowing for construction of smaller device packages consistent with current shrinking 2.5/3D chip packaging technologies.

Figure 4:
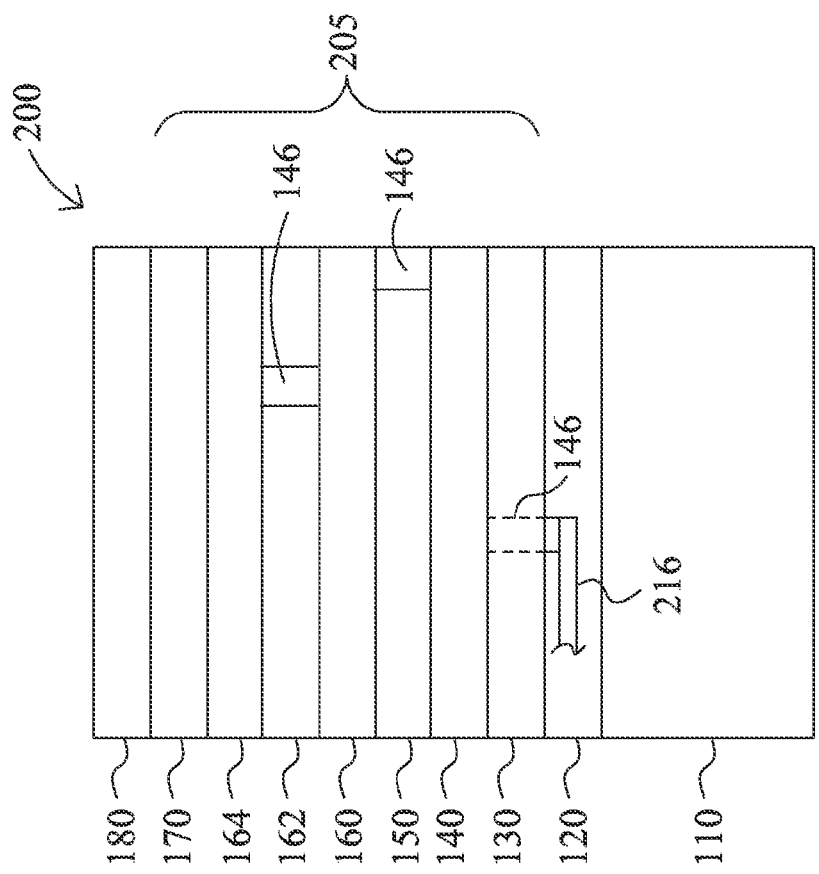
FIG. 4 is a cross-sectional side view of a second embodiment of a semiconductor structure having an in situ chip level ferrite bead inductor according to the present disclosure.

FIGS. 4 and 5 show a semiconductor structure 200 having an alternative embodiment of ferrite bead inductor 205 comprising more than one interconnected conductive coils 220 disposed at different spaced apart levels within the structure. The structure of ferrite bead inductor 205 is similar to ferrite bead inductor 105 shown in FIGS. 1 and 3, but instead is a three-layer inductor 205 (i.e. three coiled metal layers defining coils 220) semiconductor structure as opposed to a single layer inductor 105 (single coiled metal layer). An additional dielectric layer 162 and metal layer 164 are formed between the ferrite layers 130, 170 with the ferrite layers remaining outboard (i.e. above and below) metal layers 140, 160, and 162. The ferrite and dielectric layers are omitted in FIG. 5 for clarity in showing the three coils 220 of ferrite bead inductor 205.

With continuing reference to FIGS. 4 and 5, the metal layers 140, 160, 164 each defining a conductive coil 220 are interconnected by vias 146 as shown. An input terminal 210 is formed in the spiral of the uppermost coiled metal layer 164 for connection to the next wiring level and circuit formed above in semiconductor structure 100 or a lateral circuit at the same level. The lowermost coiled metal layer 140 forms an output terminal 214 which is disposed at the center of the spiral for connection to the next wiring level and circuit formed below. A via 146 may be provided that extends below ferrite layer 130 and enters dielectric layer 120 in semiconductor structure 200. In some embodiments, this via 146 may be connected to a straight lead 216 disposed in dielectric layer 120 having a terminal end 212 for connection to a lateral or other circuit in the semiconductor structure.

It will be appreciated that any number of inductor layers may be constructed employing the same approach as in the semiconductor structures described herein and shown in FIGS. 1-2 and 4-5. If an even number of coiled metal layers are used, both the input and output terminals will be positioned on the outside of the coils facilitating connection to other circuits in the semiconductor structure without additional vias or straight conductive leads.

Figure 6:
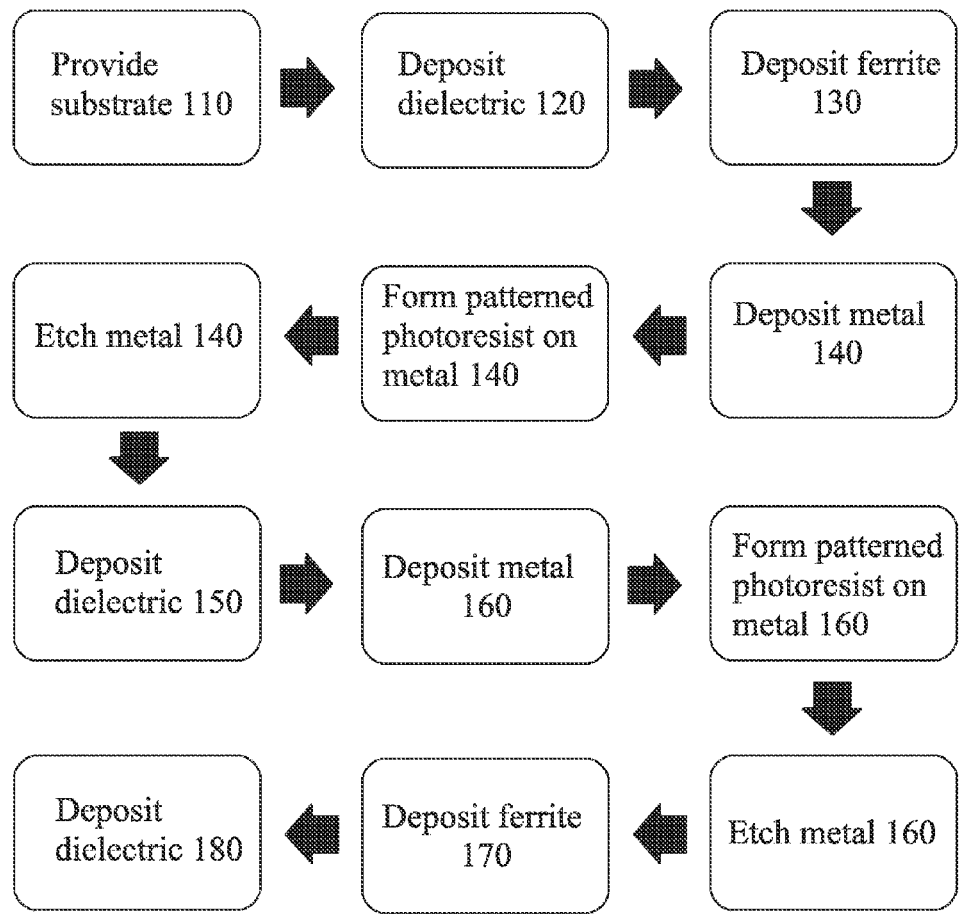
FIG. 6 is a flow chart showing sequential steps in an exemplary process for forming an in situ chip level ferrite bead inductor according to the present disclosure.

An exemplary method for forming an in situ chip-level ferrite bead inductor 105 will now be briefly described with reference to FIGS. 1, 2, and 6. FIG. 6 is a flow chart showing the basic process steps. The process may be a BEOL process in some embodiments.

Referring specifically to FIG. 6, the method begins by providing a substrate 110 and depositing dielectric layer 120 thereon. Ferrite layer 130 is next deposited on dielectric layer 120 (step 310). In some embodiments, ferrite layers 130 and 170 may be solid flat layers. In other possible embodiments, ferrite layers 130, 170 may be photoresist patterned and etched to have a pattern that may match or complement the configuration of the patterned metal layers described herein.

The first metal layer 140 is then deposited on ferrite layer 130. A patterned photoresist is next formed on metal layer 140 to produce the intended metal configuration desired. In this embodiment, a straight lead 168 will be produced (see FIG. 2). The patterned photoresist step is a photolithography process used in the art including sub-steps that may comprise depositing a photoresist material, positioning a reticle mask above the photoresist having the inverse of the desired final metal pattern formed therein, photo exposure involving exposing the unprotected portions of the photoresist to a light such as UV in some embodiments shined through the mask, and developing and removing portions of the photoresist exposed to the light leaving portions of the photoresist material in place to protect the intended final metal pattern from being etched.

With the patterned photoresist remaining on metal layer 140, this metal layer is next etched using a suitable wet etching or dry gas plasma etching having an etch selectively selected for preferentially removing the exposed portions of metal layer 140 material not protected by the photoresist. It is well within the abilities of one skilled in the art to select a suitable etching chemistry and process. After metal layer 140 is etched, the photoresist is completely removed by any suitable wet or dry ashing process. The protected metal remaining in metal layer 140 will be configured as straight lead 168.

With continuing reference to FIGS. 1, 2, and 6, the method for forming ferrite bead inductor 105 continues by depositing dielectric layer 150 on etched metal layer 140. The second metal layer 160 is next deposited on dielectric layer 150. A patterned photoresist is next formed on metal layer 160 in a similar manner described above to produce the intended metal configuration desired. In this embodiment, a coiled or spiral metal lead 142 will be produced (see FIG. 2). Metal layer 160 is next etched in a similar manner described above. After metal layer 160 is etched, the photoresist is completely removed by any suitable wet or dry ashing process. The protected metal remaining in metal layer 160 will be configured as the coiled lead 142.

The method continues by next depositing ferrite layer 170 on metal layer 160, and then finally depositing the dielectric layer 180 thereon.

During the foregoing method, it will be appreciated that metal vias 146 may be formed at appropriate times during the basis process by any means commonly used in the art. This may involve etching or milling the via hole(s) in dielectric layer 150 (see FIG. 1) after that layer is deposited, and then filling the hole with a suitable metal conductor material by any appropriate process used in the art including plating. In some embodiments, the via hole(s) may be filled at the same time metal layer 160 is deposited if the same material is used for the via 146 and layer 160. This process may be used to produce any number or configuration of vias 146 as will be understood by those in the art.

The ferrite bead inductor 205 of FIGS. 4 and 5 may be produced by a similar method to that described above.

In one embodiment according to the present disclosure, a semiconductor structure with chip-level ferrite bead inductor includes a substrate, a first dielectric layer formed on the substrate, a lower ferrite layer formed on the first dielectric layer and an upper ferrite layer spaced vertically apart from the lower ferrite layer, a first metal layer formed above the lower ferrite layer, a second metal layer formed below the upper ferrite layer, wherein at least the first or second metal layer has a coil configuration, and at least one second dielectric layer disposed between the first and second metal layers.

In another embodiment, a semiconductor chip with in situ ferrite bead inductor includes a substrate, a first dielectric layer formed on the substrate, a planar lower ferrite layer formed on the first dielectric layer, a first metal layer formed on the first ferrite layer, a second dielectric layer formed on the first metal layer, a second metal layer formed on the second dielectric layer, the second metal layer being patterned to define a first conductive coil comprising multiple turns, a via electrically connecting the first conductive coil to the first conductive lead, and a planar upper ferrite layer disposed above the first conductive coil.

In one embodiment, a method for forming an in situ chip-level ferrite bead inductor includes: depositing a first dielectric layer on a substrate; depositing a lower ferrite layer on the first dielectric layer; depositing a first metal layer on the lower ferrite layer; patterning the first metal layer to form a first conductive lead having a configuration; depositing a second dielectric layer on the patterned first metal layer; depositing a second metal layer on the second dielectric layer; patterning the second metal layer to form a conductive coil having multiple turns; and forming an upper ferrite layer above the patterned second metal layer. In some embodiments, the upper ferrite layer is formed directly onto the patterned second metal layer. The method may further include: depositing a third dielectric layer on the patterned second metal layer; depositing a third metal layer on the third dielectric layer; and patterning the third metal layer to form a conductive coil having multiple turns.

While the foregoing description and drawings represent exemplary embodiments of the present disclosure, it will be understood that various additions, modifications and substitutions may be made therein without departing from the spirit and scope and range of equivalents of the accompanying claims. In particular, it will be clear to those skilled in the art that embodiments according to the present disclosure may be include other forms, structures, arrangements, proportions, sizes, and with other elements, materials, and components, without departing from the spirit or essential characteristics thereof. One skilled in the art will further appreciate that the embodiments may be used with many modifications of structure, arrangement, proportions, sizes, materials, and components and otherwise, used in the practice of the invention, which are particularly adapted to specific environments and operative requirements without departing from the principles of the present invention. In addition, numerous variations in the exemplary methods and processes described herein may be made without departing from the spirit of the present disclosure. The presently disclosed embodiments are therefore to be considered in all respects as illustrative and not restrictive, the scope of the invention being defined by the appended claims and equivalents thereof, and not limited to the foregoing description or embodiments.

What is claimed is:

1. A semiconductor structure with chip-level ferrite bead inductor comprising:
    a substrate;
    a first dielectric layer formed on the substrate;
    a lower ferrite layer formed on the first dielectric layer and an upper ferrite layer spaced vertically apart from the lower ferrite layer;
    a first metal layer formed above the lower ferrite layer;
    a second metal layer formed below the upper ferrite layer, wherein at least the first or second metal layer has a coil configuration; and
    at least one second dielectric layer disposed between the first and second metal layers.

2. The semiconductor structure of claim 1, further comprising a conductive via electrically connecting the first and second metal layers together.

3. The semiconductor structure of claim 1, wherein the first metal layer is configured as a straight conductive lead.

4. The semiconductor structure of claim 1, further comprising:
    a third dielectric layer disposed between the first and second metal layers; and
    a third metal layer disposed between the upper and lower ferrite layer, and further disposed between the second and third dielectric layers.

5. The semiconductor structure of claim 4, wherein the first, second, and third metal layers have a coil configuration.

6. The semiconductor structure of claim 5, wherein the first, second, and third metal layers are electrically interconnected by conductive vias extending vertically through the semiconductor structure.

7. The semiconductor structure of claim 1, wherein the substrate is silicon or high resistivity silicon.

8. The semiconductor structure of claim 1, wherein the second dielectric layer has a greater thickness than the first dielectric layer.

9. The semiconductor structure of claim 1, wherein the second dielectric layer directly contacts both the first and second metal layers.

10. A semiconductor chip with in situ ferrite bead inductor comprising:
    a substrate;
    a first dielectric layer formed on the substrate;
    a planar lower ferrite layer formed on the first dielectric layer;
    a first metal layer formed on the lower ferrite layer;
    a second dielectric layer formed on the first metal layer;
    a second metal layer formed on the second dielectric layer, the second metal layer being patterned to define a first conductive coil comprising multiple turns;
    a via electrically connecting the first conductive coil to the first metal layer; and
    a planar upper ferrite layer disposed above the first conductive coil.

11. The semiconductor chip of claim 10, wherein the upper ferrite layer directly contacts the first conductive coil.

12. The semiconductor chip of claim 10, wherein the first metal layer is patterned to define a conductive straight lead.

13. The semiconductor chip of claim 10, wherein the first metal layer is patterned to define a second conductive coil comprising multiple turns.

14. The semiconductor chip of claim 10, further comprising:
    a third dielectric layer disposed between the first and second metal layers; and
    a third metal layer disposed between the upper and lower ferrite layer, and further disposed between the second and third dielectric layers.

15. The semiconductor chip of claim 10, wherein the substrate is silicon or high resistivity silicon.

16. The semiconductor chip of claim 15, wherein the substrate is a CMOS substrate containing active devices.

17. The semiconductor chip of claim 10, wherein the second dielectric layer directly contacts both the first and second metal layers.

18. A method for forming an in situ chip-level ferrite bead inductor comprising:
    depositing a first dielectric layer on a substrate;
    depositing a lower ferrite layer on the first dielectric layer;
    depositing a first metal layer on the lower ferrite layer;
    patterning the first metal layer to form a first conductive lead having a configuration;
    depositing a second dielectric layer on the patterned first metal layer;
    depositing a second metal layer on the second dielectric layer;
    patterning the second metal layer to form a conductive coil having multiple turns; and
    forming an upper ferrite layer above the patterned second metal layer.

19. The method of claim 18, wherein the upper ferrite layer is formed directly onto the patterned second metal layer.

20. The method of claim 18, further comprising:
    depositing a third dielectric layer on the patterned second metal layer;
    depositing a third metal layer on the third dielectric layer; and
    patterning the third metal layer to form a conductive coil having multiple turns.

* * * * *